(12) United States Patent
Pan et al.

(10) Patent No.: US 12,456,916 B2
(45) Date of Patent: Oct. 28, 2025

(54) POWER FILTER

(71) Applicant: Harman Becker Automotive Systems GmbH, Karlsbad (DE)

(72) Inventors: Zhongfeng Pan, Shanghai (CN); Chong Liu, Jiangsu (CN); Weijia Lu, Shanghai (CN); Lei Wang, Jiangsu (CN); Qingfeng Xia, Jiangsu (CN); Shangpeng Li, Jiangsu (CN); Qiang Zhou, Shanghai (CN); Guangjun Qin, Shanghai (CN)

(73) Assignee: HARMAN BECKER AUTOMOTIVE SYSTEMS GMBH, Karlsbad-Ittersbach (DE)

( * ) Notice: Subject to any disclaimer, the term of this patent is extended or adjusted under 35 U.S.C. 154(b) by 491 days.

(21) Appl. No.: 17/933,043

(22) Filed: Sep. 16, 2022

(65) Prior Publication Data

US 2023/0089880 A1    Mar. 23, 2023

(30) Foreign Application Priority Data

Sep. 17, 2021    (CN) .......................... 202111091247.5

(51) Int. Cl.
*H02M 1/32*    (2007.01)
*H02M 1/44*    (2007.01)
*H02M 3/155*   (2006.01)

(52) U.S. Cl.
CPC ............... *H02M 1/32* (2013.01); *H02M 1/44* (2013.01); *H02M 3/155* (2013.01)

(58) Field of Classification Search
CPC ...... H03G 1/0029; H03G 1/00; H03G 1/0005; H03G 1/0017; H03G 3/20; H03G 3/30; H03H 11/1291; H03H 11/12; H03H 1/02; H03H 1/00
See application file for complete search history.

(56) References Cited

FOREIGN PATENT DOCUMENTS

| CN | 203813660 U | 9/2014 |
|----|-------------|--------|
| EP | 2897273 A1  | 7/2015 |

OTHER PUBLICATIONS

European Patent Office, Extended European Search Report Issued in Application No. 22191473.2, Feb. 10, 2023, Germany, 7 pages.

*Primary Examiner* — Diana J. Cheng
(74) *Attorney, Agent, or Firm* — McCoy Russell LLP

(57) ABSTRACT

The present disclosure provides a power filter. The power filter may include an overvoltage protection circuit and an LC filter circuit connected to the overvoltage protection circuit, wherein the overvoltage protection circuit includes a voltage regulator and a peak compensation circuit. The peak compensation circuit is configured to generate a gain peak at a resonance frequency of the LC filter circuit, so as to compensate for a gain dip at the voltage regulator stage occurring at the resonance frequency of the LC filter circuit.

8 Claims, 7 Drawing Sheets

POWER FILTER

CROSS REFERENCE TO RELATED APPLICATIONS

The present application claims priority to Chinese Patent Application No. 202111091247.5, entitled "POWER FILTER", and filed on Sep. 17, 2021, The entire contents of the above-listed application is hereby incorporated by reference for all purposes.

TECHNICAL FIELD

The present disclosure generally relates to electronic circuit technology, and particularly relates to a power filter.

BACKGROUND

For a power filter, such as a line filter, it is often necessary to compensate for its control loop. However, since an LC filter included in the power filter will bring the influence of instability to the control loop at a resonance frequency of the LC, the compensation for the control loop becomes more difficult.

Therefore, there is a need for a new technical solution for loop compensation of a power filter to eliminate the above influence of instability.

SUMMARY

According to one aspect of the present disclosure, a power filter is provided. The power filter may include an overvoltage protection circuit and an LC filter circuit connected to the overvoltage protection circuit, wherein the overvoltage protection circuit includes a voltage regulator and a peak compensation circuit. The peak compensation circuit is configured to generate a gain peak at a resonance frequency of the LC filter circuit, so as to compensate for a gain dip at the voltage regulator stage occurring at the resonance frequency of the LC filter circuit.

According to one or more embodiments, the peak compensation circuit may be implemented as an LCR parallel resonance circuit.

According to one or more embodiments, the peak compensation circuit may include an equivalent inductance circuit and RC components connected in parallel.

According to one or more embodiments, the RC components include a first resistor and a first capacitor connected in parallel, and the equivalent inductance circuit may include an operational amplifier and a second resistor connected between a reverse input terminal and an output terminal of the operational amplifier.

According to one or more embodiments, the peak compensation circuit may further include a first voltage-dividing resistor and a second voltage-dividing resistor connected in series.

According to one or more embodiments, the LC filter circuit may include a filter inductor and a filter capacitor connected in series, a first terminal of the filter inductor is connected to the voltage regulator, a second terminal of the filter inductor is connected to a first terminal of the filter capacitor, and a second terminal of the filter capacitor is connected to a ground terminal.

According to one or more embodiments, a first terminal of the first voltage-dividing resistor is connected to the voltage regulator and is connected to the first terminal of the filter inductor, a second terminal of the first voltage-dividing resistor is connected to a first terminal of the second voltage-dividing resistor, a second terminal of the second voltage-dividing resistor is connected to the ground terminal, and the second terminal of the first voltage-dividing resistor and the first terminal of the second voltage-dividing resistor are connected to a forward input terminal of the operational amplifier.

According to one or more embodiments, a first terminal of the first capacitor is connected to a first terminal of the first resistor, and the first terminal of the first capacitor and the first terminal of the first resistor are also connected to the reverse input terminal of the operational amplifier.

According to one or more embodiments, the voltage regulator may be an MOSFET regulator or a triode regulator.

According to one or more embodiments, the power filter may be used for a vehicle, such as an audio system of a vehicle.

BRIEF DESCRIPTION OF THE DRAWINGS

The present disclosure may be better understood by reading the following description of non-restrictive embodiments with reference to the drawings.

DETAILED DESCRIPTION

Figure 1:
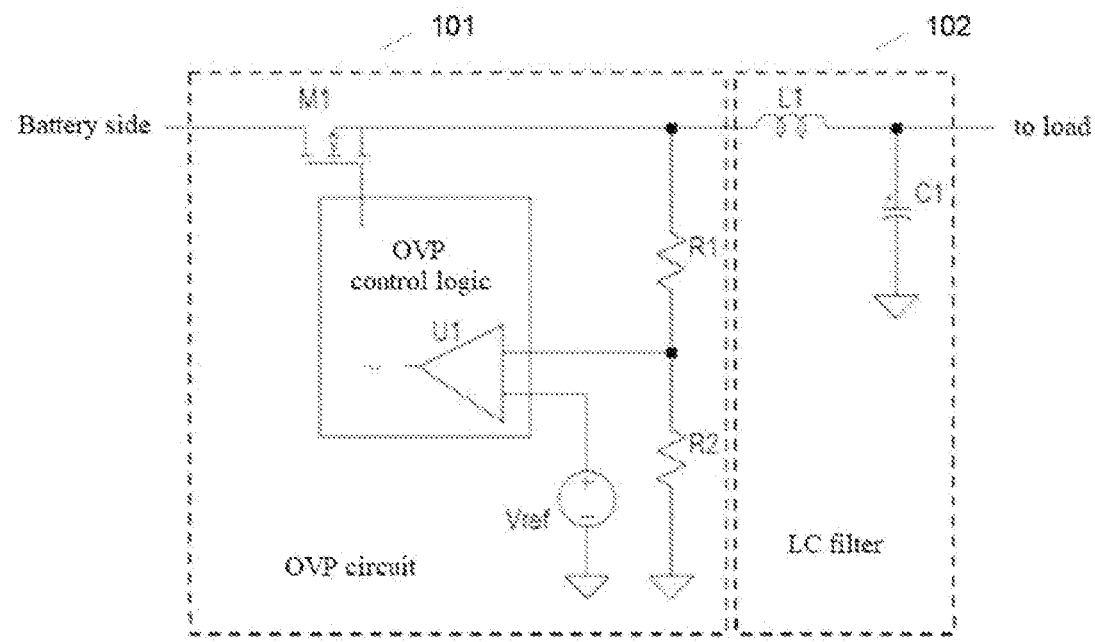
FIG. 1 is a schematic structural diagram of an exemplary power filter.

It should be understood that the following description of the embodiments is given for the purpose of illustration only rather than limitation. The division of examples in functional blocks, modules, or units shown in the drawings should not be construed as implying that these functional blocks, modules, or units must be implemented as physically separated units. The functional blocks, modules, or units shown or described may be implemented as separate units, circuits, chips, functional blocks, modules, or circuit elements. One or more functional blocks or units may also be implemented in a common circuit, chip, circuit element, or unit.

The use of singular terms (such as, but not limited to, "a") is not intended to limit the number of items. Relational terms, such as, but not limited to, "top," "bottom," "left," "right," "upper," "lower," "down," "up," "side," "first," "second" ("third," etc.), "inlet," "outlet," etc. are used in the written description for clarity in specific reference to the drawings and are not intended to limit the scope of the present disclosure or the appended claims, unless otherwise indicated. The terms "couple," "coupling," "being coupled," "coupled," "coupler" and similar terms are widely used herein, and may include means for fixing, combining, bonding, fastening, attaching, jointing and inserting thereon, forming thereon or therein and communicating, or otherwise directly or indirectly mechanically, magnetically, electrically, chemically and operationally associating with intermediate elements and one or more members, or may also include, but is not limited to, any method or device for integrally forming one member with another member in a unified manner. Coupling may occur in any direction, including rotationally. The terms "including" and "such as" are illustrative rather than restrictive, and the word "may" means "may, but not necessarily" unless stated otherwise. Although any other language is used in the present disclosure, the embodiments shown in the drawings are examples given for purposes of illustration and explanation, and are not the only embodiments of the subject herein.

FIG. 1 is a schematic diagram of an exemplary power filter. For example, the power filter (such as a line filter) shown in FIG. 1 may include an overvoltage protection (OVP) circuit 101 and an LC filter circuit 102. The OVP circuit 101 is used for clamping the voltage during sudden drop of a load and other overvoltage conditions. The working principle of the OVP circuit is similar to that of a low dropout regulator (LDO). For example, when an input voltage is lower than a clamp voltage (such as 17 V), an output voltage follows the input voltage. When the input voltage is higher than the clamp voltage, the output voltage is adjusted to the clamp voltage. The LC filter circuit 102 is used for filtering out transients from a wire harness side to block the ripple current generated by the load to the wire harness direction.

Figure 2:
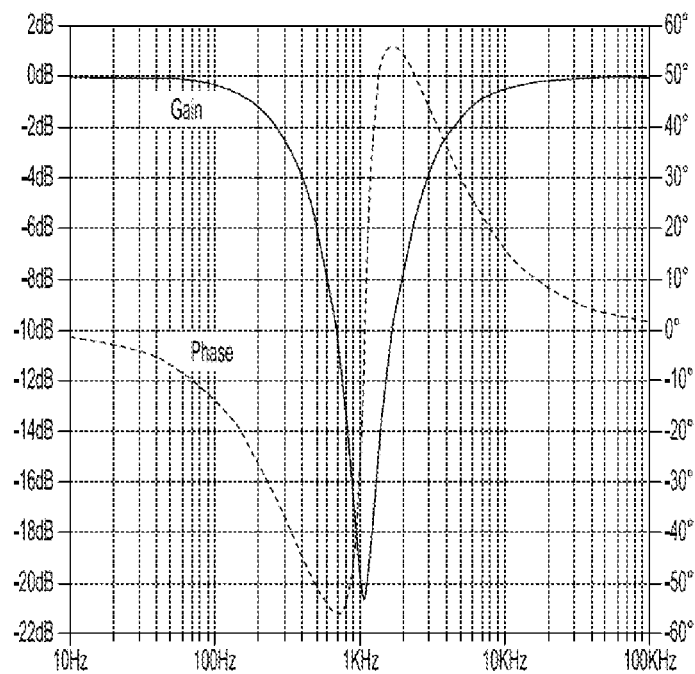
FIG. 2 shows a gain-frequency Bode diagram of an M1 stage in the power filter shown in FIG. 1.

FIG. 1 exemplarily shows main parts of the OVP circuit 101, which may include, for example, a voltage regulator M1, an OVP control logic circuit including an operational amplifier U1, and voltage-dividing resistors R1 and R2. The LC filter circuit 102 may include, for example, an inductor L1 and a capacitor C1. The inductor L1 and the capacitor C1 constitute an LC resonance circuit. At the LC resonance frequency, it is a low LC resonance impedance seen from the M1 stage side, which is mainly determined by the direct current resistance (DCR) of the inductor and the equivalent series resistance (ESR) of the capacitor. The gain of the M1 stage is: "load impedance"/("load impedance"+"output impedance of M1"). At the LC resonance frequency, the load impedance may be much smaller than the output impedance of M1, and at this moment, a gain dip at the LC resonance frequency will be caused. FIG. 2 shows a gain-frequency Bode diagram of the M1 stage, wherein the curve represented by the solid line is a gain curve, and the curve represented by the dotted line is a phase curve. As can be seen from the gain curve in the Bode diagram in FIG. 2, there is a distinct gain dip near the LC resonance frequency. This gain dip makes the compensation for the control loop very difficult.

Figure 3:
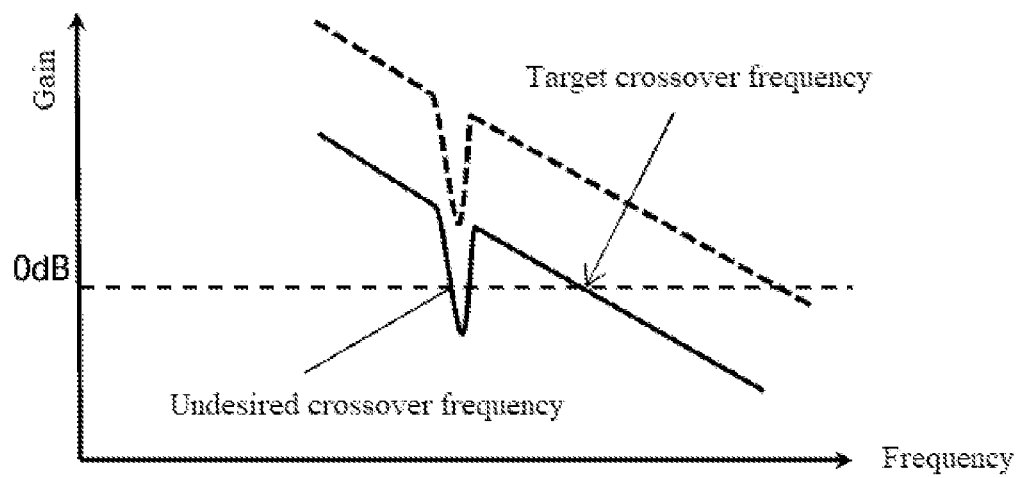
FIG. 3 shows a schematic diagram of a method used for eliminating a gain dip occurring in FIG. 2.

When compensating for the OVP control loop, the dip in this gain makes the loop unstable. When compensating for the control loop of a minimum phase system, a slope of an open-loop gain-frequency curve at a crossover frequency may be selected as −20 dB/dec, so as to maintain a sufficient phase margin, wherein the crossover frequency is a frequency at which the gain-frequency curve intersects with a 0 dB line. When the gain dip is above the −20 dB/dec slope, as shown in FIG. 3, it is likely to cross the 0 dB line with a phase lag close to 180, which makes the control loop unstable. For example, in FIG. 3, the arrow on the right side points to a target crossover frequency, and the straight line on the left side points to two undesired intersections with the 0 dB line caused by the gain dip.

To eliminate the undesired intersections caused by the gain dip, one method is to select the crossover frequency to be much higher than a gain dip frequency corresponding to the gain dip. For example, it can be seen from the curve represented by the dotted line in FIG. 3 that the crossover frequency in the curve represented by the dotted line is selected to be much greater than the frequency at the gain dip, so that the gain at the dip frequency is greater than the 0 dB line. This is feasible when the frequency at which the gain dip occurs is relatively low and the dip is relatively shallow.

However, with the trend of selecting inductors with low inductances and polymer capacitors, the above method of compensating for the gain dip faces new difficulties. For example, the trend for the LC filter circuit in the power filter is to use an inductor with a lower inductance in the same package, so as to improve the current processing capacity. In addition, polymer capacitors are replacing aluminum capacitors in many applications. The ESR of a polymer capacitor is much lower than that of an aluminum capacitor, and the polymer capacitor can process higher ripple currents. Therefore, when the polymer capacitor is used, the LC filter circuit usually uses a smaller capacitor. As a result, there is a situation where the frequency at which the gain dip occurs is shifted to a higher frequency. Worse, the dip in the gain becomes deeper when the polymer capacitor is used. If the above method is still used, the crossover frequency needs to be shifted to a higher frequency. In some cases, the crossover frequency may need to be shifted to a frequency above 100 KHz. At a high frequency, there are often poles contributed by other circuits inside the control loop. If the crossover frequency is selected to be close to these poles, the control loop will become unstable.

In order to further overcome the defects of the above compensation scheme, a plurality of the following embodiments of the present disclosure additionally provide a power filter, wherein a system for loop compensation is designed. The system can generate a gain peak for compensating for the above gain dip. The power filter may include an overvoltage protection circuit and an LC filter circuit (LC filter) connected to the overvoltage protection circuit, wherein the overvoltage protection circuit may include a voltage regulator and a peak compensation circuit. The peak compensation circuit is configured to generate a gain peak at a resonance frequency of the LC filter circuit, so as to compensate for a gain dip occurring at the voltage regulator stage at the resonance frequency of the LC filter circuit. The compensation system in the power filter provided by the present disclosure can solve the difficulty in loop compensation of the power filter in a low-cost and easy-to-implement manner through ingenious circuit design.

Figure 4:
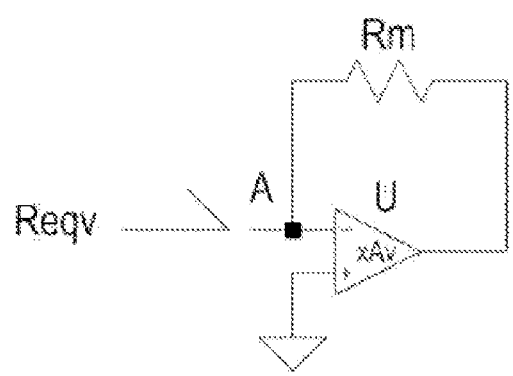
FIG. 4 shows a schematic diagram of principle of an equivalent inductance according to one or more embodiments of the present disclosure.

A plurality of embodiments of the present disclosure will be further described below with reference to each of the drawings. According to some embodiments, the peak compensation circuit in the system may be implemented as an LCR resonance circuit, such as an LCR parallel resonance circuit. The LCR parallel resonance circuit may include an equivalent inductance circuit and RC components connected in parallel. FIG. 4 exemplarily shows a schematic diagram of an equivalent inductance circuit. As shown in FIG. 4, two ends of a resistor Rm can be respectively connected to the output terminal and the reverse input terminal of an operational amplifier U. Then, due to the Miller effect, the equivalent resistance seen from the reverse input terminal of the operational amplifier is the resistance of the resistor divided by (1+Av), wherein Av represents a gain of the operational amplifier. The gain of the operational amplifier decreases at a slope of −20 dB/dec with the increasing frequency in a frequency band of interest, and the equivalent resistance increases at a slope of 20 dB/dec with the increasing frequency, thus exhibiting the characteristics of the inductor. The equivalent inductance can be calculated by the following formulas:

$$R_{eqv} = \frac{Rm}{1+Av} \approx \frac{Rm}{\frac{GB_{OP\_in\_rad/s}}{s}} \approx s \cdot \frac{Rm}{GB_{OP\_in\_rad/s}} = s \cdot L_{eqv}$$

$$L_{eqv} = \frac{Rm}{GB_{OP\_in\_rad/s}}$$

wherein Reqv represents an equivalent resistance; Leqv represents an equivalent inductance; GBOP_in_rad/s represents a gain bandwidth product of the operational amplifier, and the unit is radian/second; s represents a differential symbol in Laplace transform; and Av represents a voltage gain of the operational amplifier.

Figure 5A:
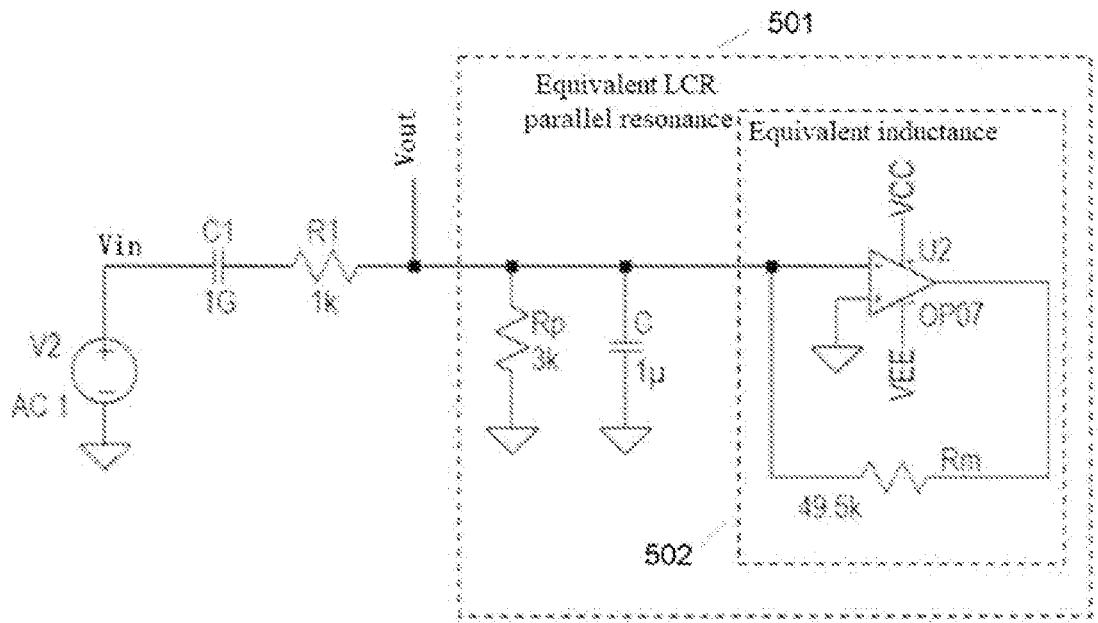
FIG. 5A shows a schematic diagram of circuit principle according to one or more embodiments of the present disclosure.
Figure 5B:
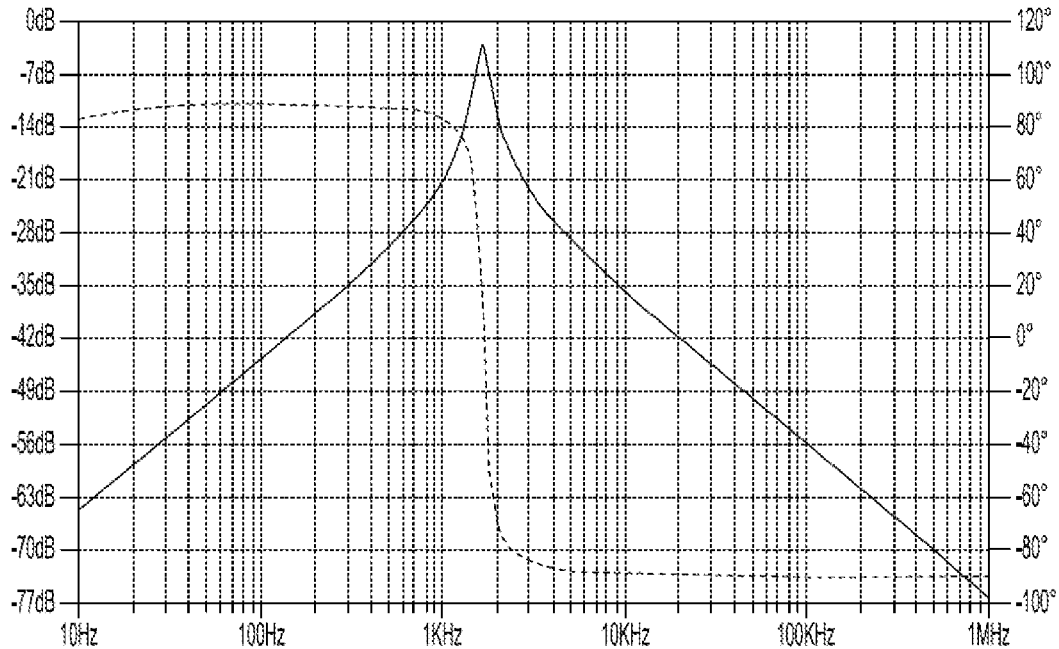
FIG. 5B shows a gain-frequency Bode diagram measured at a point Vout in FIG. 5A.

Then, the equivalent inductance circuit composed of the resistor and the operational amplifier can be combined with RC components (capacitor and resistor components) to form an LCR resonance circuit. For example, the equivalent inductance circuit is designed to resonate with the RC components to form an LCR parallel resonance circuit. FIG. 5A exemplarily shows a schematic diagram of the formed LCR parallel resonance circuit. As shown in FIG. 5A, a box 501 corresponds to an LCR parallel resonance circuit, and a box 502 corresponds to an equivalent inductance circuit or an equivalent inductor. For example, the LCR parallel resonance circuit 501 may include an equivalent inductance circuit, a resistor Rp, and a capacitor C. The equivalent inductance circuit may include an operational amplifier U2 and a resistor Rm, wherein two ends of the resistor Rm are respectively connected to the output terminal and the reverse input terminal of the operational amplifier U2. A quality factor Q of the resonance circuit can be tuned by tuning the equivalent resistance of the LCR resonance circuit. One connecting point of the Rp and the C connected in parallel is connected to the reverse input terminal of the operational amplifier, and the other connecting point of the Rp and the C connected in parallel can be connected to an AC ground terminal. The AC ground terminal may be a DC voltage, such as a reference voltage. It can be understood by those skilled in the art that FIG. 5A is only for the purpose of exemplarily showing the principle of the LCR parallel resonance circuit, and is not intended to limit the addition or reduction of other electronic components. The LCR resonance circuit constructed in FIG. 5A can generate a gain peak at a resonance frequency. FIG. 5B shows a gain-frequency Bode diagram measured at a point Vout in FIG. 5A. As can be seen from FIG. 5B, a peak can be generated at a certain frequency in the gain-frequency curve. The position of the frequency at which the peak occurs and the magnitude of the peak may be changed according to the change of the value of each of the components of the LCR resonance circuit. The curve represented by the dotted line in the figure is a phase-frequency curve.

Figure 6:
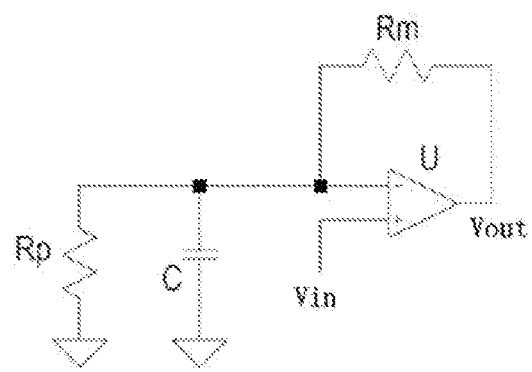
FIG. 6 shows a schematic diagram of simplified principle of an LCR resonance circuit according to one or more embodiments of the present disclosure.
Figures 7A, 7B:
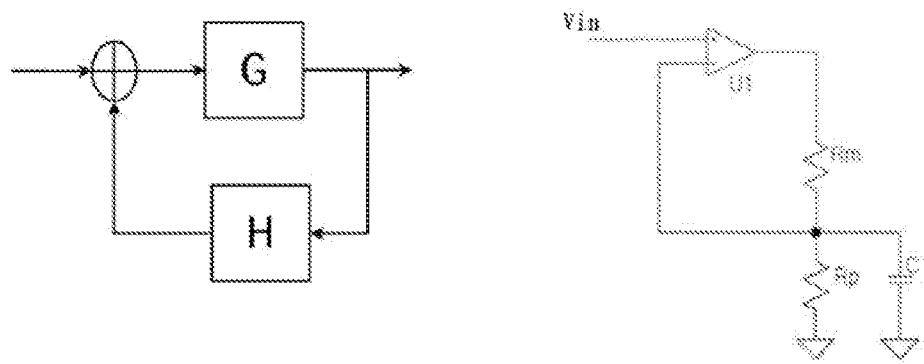
FIG. 7A and FIG. 7B show equivalent transformation forms of the circuit shown in FIG. 6.

The designed LCR resonance circuit having the expected gain-frequency characteristic will be further described below with reference to FIG. 6. FIG. 6 exemplarily shows a schematic diagram of an LCR resonance circuit. In order to simplify the description for facilitating the understanding, FIG. 6 can also be equivalently transformed into the forms shown in FIG. 7A and FIG. 7B. In FIG. 7A, G represents a forward amplification gain of the operational amplifier, that is, a gain of the operational amplifier itself. H represents a feedback coefficient of a feedback network, which may be, for example, a voltage-dividing ratio of a voltage-dividing network composed of the resistors Rm and Rp and the capacitor C in FIG. 6. A transfer function of the circuit shown in FIG. 6 can be expressed as the following equation:

$$A_{close} = \frac{G}{1+G \cdot H} \approx \frac{\frac{BW_{OPA\_in\_rad/s}}{s}}{1 + \frac{BW_{OPA\_in\_rad/s}}{s} \cdot \frac{Rp}{(Rp+Rm)} \cdot \frac{1}{(1+(Rp//Rm) \cdot C \cdot s)}} =$$

$$\frac{BW_{OPA\_in\_rad/s}(1+s \cdot (Rp//Rm) \cdot C)}{BW_{OPA\_in\_rad/s} \cdot \frac{Rp}{(Rp+Rm)} + s + (Rp//Rm) \cdot C \cdot s^2} =$$

$$\frac{(1+s \cdot (Rp//Rm) \cdot C)}{\frac{Rp}{(Rp+Rm)}[1 + \frac{1}{BW_{OPA\_in\_rad/s} \cdot \frac{Rp}{(Rp+Rm)}}s + \frac{Rm \cdot C}{BW_{OPA\_in\_rad/s}} \cdot s^2]}$$

wherein BWOPA_in_rad/s represents a bandwidth of the operational amplifier, and the unit is radian/second; and s represents a differential symbol in Laplace transform.

For further understanding, the above transfer function can be further transformed into the following form, that is, Aclose can be expressed in the following form:

$$gain_{DC} \cdot \left(1 + \frac{s}{\omega_s}\right) \cdot \frac{1}{\left[1 + \frac{1}{Q}\frac{s}{\omega_o} + \left(\frac{s}{\omega_o}\right)^2\right]}$$

$$\text{wherein } gain_{DC} = \frac{Rp+Rm}{Rp}$$

$$\omega_z = \frac{1}{(Rp//Rm) \cdot C}$$

$$\omega_o = \sqrt{\frac{BW_{OPA}}{R_m \cdot C}} = \sqrt{\frac{BW_{OPA}}{\frac{R_m}{R_p}} \cdot \frac{1}{R_p \cdot C}} = \sqrt{\frac{BW_{OPA}}{gain_{DC}} \cdot \omega_Z}$$

$$Q = \frac{1}{\omega_o}BW_{OPA} \cdot \frac{Rp}{(Rp+Rm)} \approx \frac{1}{\omega_o}BW_{OPA} \cdot \frac{Rp}{Rm} =$$

$$\frac{1}{\omega_o} \cdot \frac{BW_{OPA}}{Rm \cdot C}Rp \cdot C = \frac{\omega_o}{\frac{1}{Rp \cdot C}} = \frac{\omega_o}{\omega_z}$$

Among them, $gain_{DC}$ represents a DC gain; $\omega_z$ represents a zero frequency; and $\omega_0$ represents a cutoff frequency of a second-order low-pass filter, which may correspond to the resonance frequency of the LCR resonance circuit in the present disclosure. Q represents a quality factor of the second-order low-pass filter.

When $Rp \ll Rm$, $$Q = \frac{1}{\omega_o} BW_{OPA} \cdot \frac{Rp}{(Rp+Rm)} \approx \frac{1}{\omega_o} BW_{OPA} \cdot \frac{Rp}{Rm} =$$

$$\frac{1}{\omega_o} \cdot \frac{BW_{OPA}}{Rm \cdot C} Rp \cdot C = \frac{\omega_o}{\frac{1}{Rp \cdot C}} = \frac{\omega_o}{\omega_z}$$

$$\text{gain}_{DC} = \frac{Rm}{Rp}$$

$$\omega_z = \frac{1}{Rp \cdot C}$$

Based on the calculation of each of the above parameters, a value can be designed for each of the elements of the circuit according to actual requirements of the circuit, so as to obtain the expected gain-frequency characteristic of the circuit.

Figure 8:
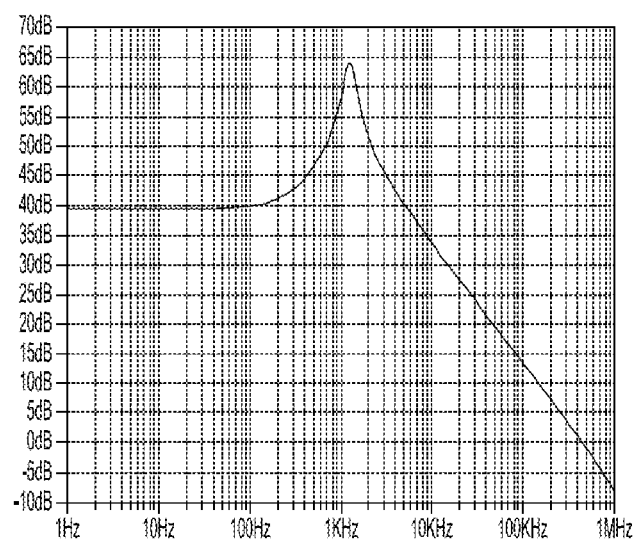
FIG. 8 shows a gain-frequency Bode diagram of the circuit shown in FIG. 6.

For example, the following values can be selected for the parameters in the above equation to generate the Bode diagram shown in FIG. 8. Among them, ω0=2π·1.5 KHz; ωz=2π·300 Hz, BWOPA_in_rad/s=2π·700 KHz; C=1 u; Rp=530 R; and Rm=49.5 kR.

As can be seen from FIG. 8, the LCR resonance circuit shown in FIG. 6 can generate a peak at a resonance frequency. The part of the curve before the resonance frequency is relatively flat, which means that the gain before the resonance frequency is flat. The part of the curve after the resonance frequency shows that the gain decreases at a slope of −20 dB/dec with the increasing frequency. The peak occurring in the gain-frequency curve can be used for compensating for the gain dip caused at the voltage regulator stage. It can be understood that the position of the peak and the magnitude of the peak can be adjusted by changing the values of the parameters.

Figure 9:
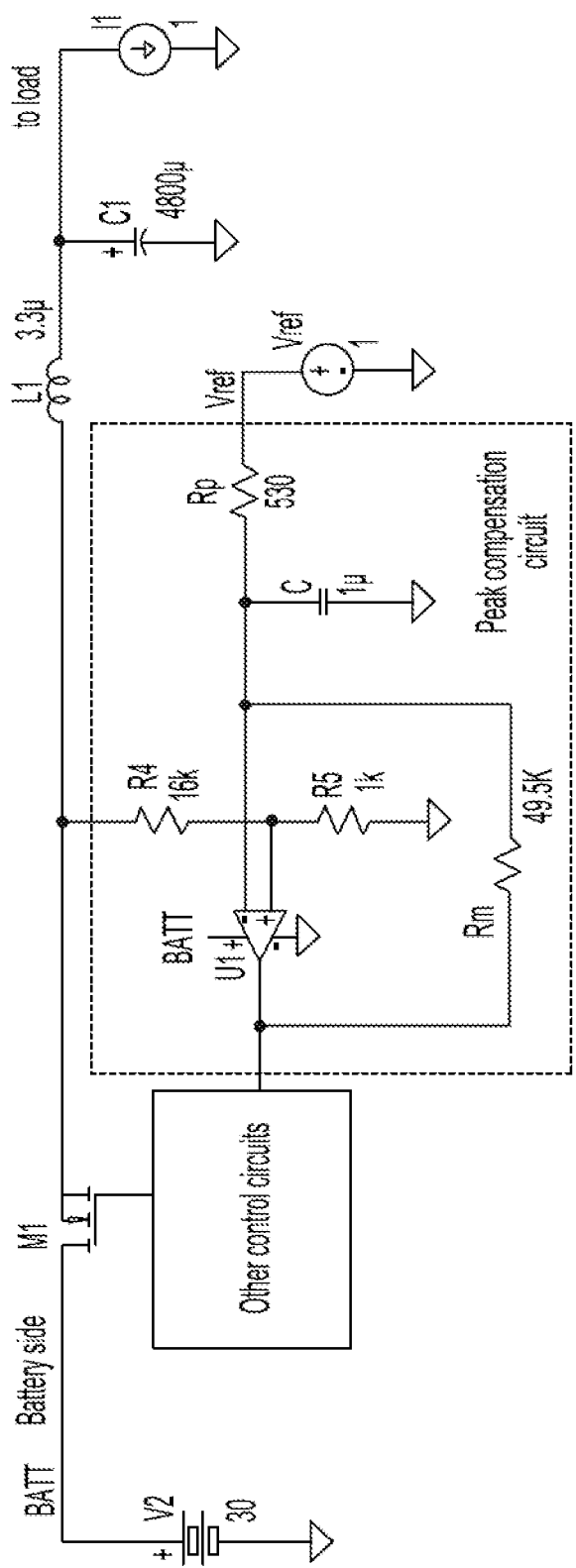
FIG. 9 shows a schematic diagram of principle of a power filter circuit according to one or more embodiments of the present disclosure.

FIG. 9 exemplarily shows a schematic diagram of implementation of a power filter circuit according to one or more embodiments of the present disclosure. FIG. 9 is only an exemplary circuit implementation schematic diagram for those skilled in the art to better understand and implement the teachings of the present disclosure, and is not a specific limitation to the technical solution of the present invention. Those skilled in the art can understand that the components can be added or reduced or the parameter values of the components can be changed according to specific application conditions of the circuit.

FIG. 9 exemplifies a power filter circuit which may include an overvoltage protection circuit and an LC filter circuit connected to the overvoltage protection circuit. In the example of FIG. 9, the overvoltage protection circuit may include a voltage regulator M1 and a peak compensation circuit. Those skilled in the art can understand that the overvoltage protection circuit may also include existing control logic or circuits implemented in various circuit forms. In FIG. 9, it is only represented by "other control circuits" and will not be elaborated. Those skilled in the art can understand that the schematic diagram of the power filter circuit is only for helping to understand the content of the present disclosure clearly and comprehensively, and is not intended to limit the present invention.

According to some embodiments, the peak compensation circuit may be implemented as an LCR parallel resonance circuit. For example, the peak compensation circuit may include an equivalent inductance circuit and RC components connected in parallel, so as to form an LCR parallel resonance circuit. The RC components may include, for example, a first resistor Rp and a first capacitor C connected in parallel. The equivalent inductance circuit may include, for example, an operational amplifier U1 and a second resistor Rm connected between the reverse input terminal and the output terminal of the operational amplifier U1. The peak compensation circuit may further include, for example, a first voltage-dividing resistor R4 and a second voltage-dividing resistor R5 connected in series. Specifically, for example, the first terminal of the first voltage-dividing resistor R4 is connected to the voltage regulator, the second terminal of the first voltage-dividing resistor R4 is connected to the first terminal of the second voltage-dividing resistor R5, and the second terminal of the second voltage-dividing resistor R5 is connected to the ground terminal. The second terminal of the first voltage-dividing resistor R4 and the first terminal of the second voltage-dividing resistor R5 are also together connected to the forward input terminal of the operational amplifier U1.

For example, the first terminal of the first capacitor C is connected to the first terminal of the first resistor Rp, and the first terminal of the first capacitor C and the first terminal of the first resistor Rp are also together connected to the reverse input terminal of the operational amplifier U1. The second terminal of the first capacitor C is connected to the ground terminal. For example, the second terminal of the first resistor Rp may be connected to the ground terminal through a reference voltage source. The output terminal of the operational amplifier U1 may be connected to the voltage regulator M1, for example, connected to the voltage regulator M1 through other control circuits. In FIG. 9, only the case where the voltage regulator is an MOSFET transistor M1 is shown for illustration. The MOSFET transistor M1 may also be replaced with a triode.

The LC filter circuit includes a filter inductor L1 and a filter capacitor C1 connected in series, the first terminal of the filter inductor L1 is connected to the voltage regulator M1, the second terminal of the filter inductor L1 is connected to the first terminal of the filter capacitor C1, and the second terminal of the filter capacitor C1 may be connected to the ground terminal.

Figure 10:
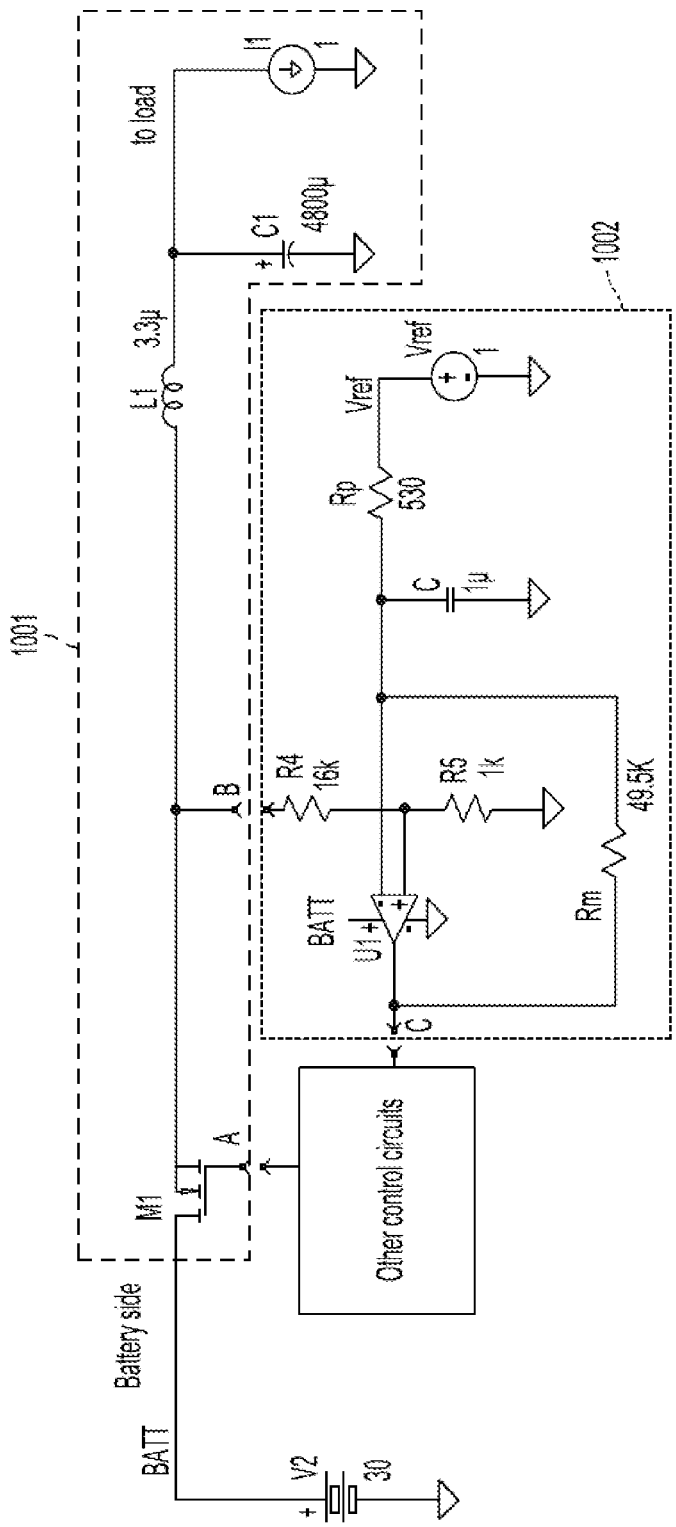
FIG. 10 shows schematically dividing a circuit for measuring a gain by taking FIG. 9 as an example.
Figure 11A:
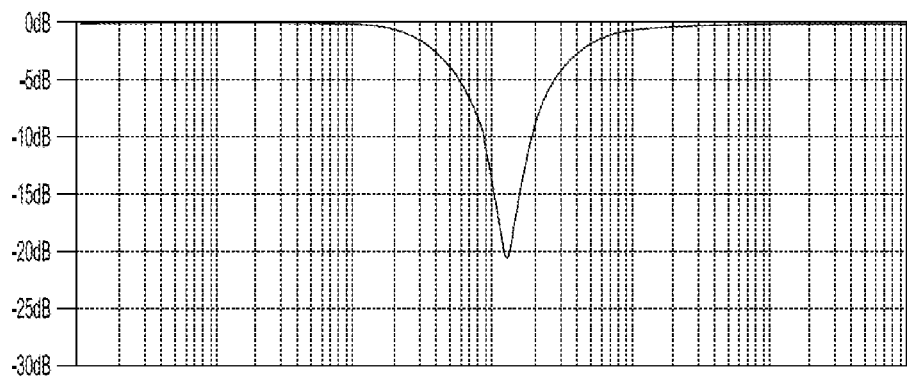
FIG. 11A, FIG. 11B, and FIG. 11C respectively show gain-frequency Bode diagrams measured corresponding to FIG. 10.
Figure 11B:
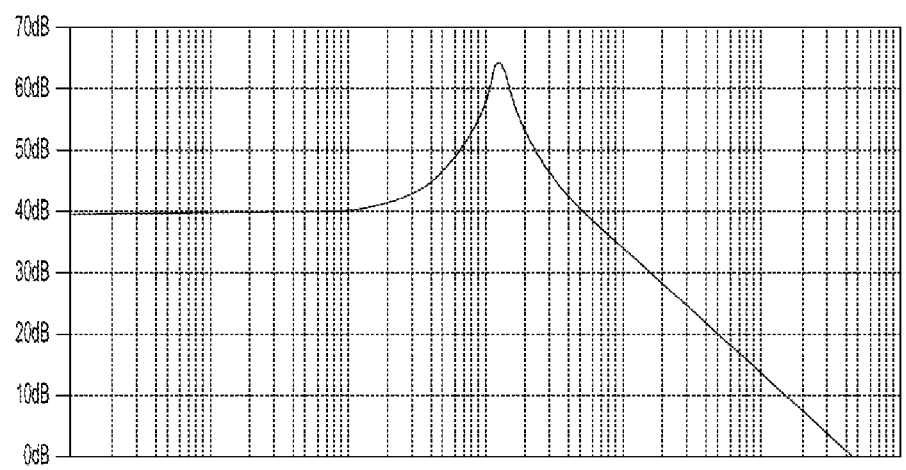
Figure 11C:
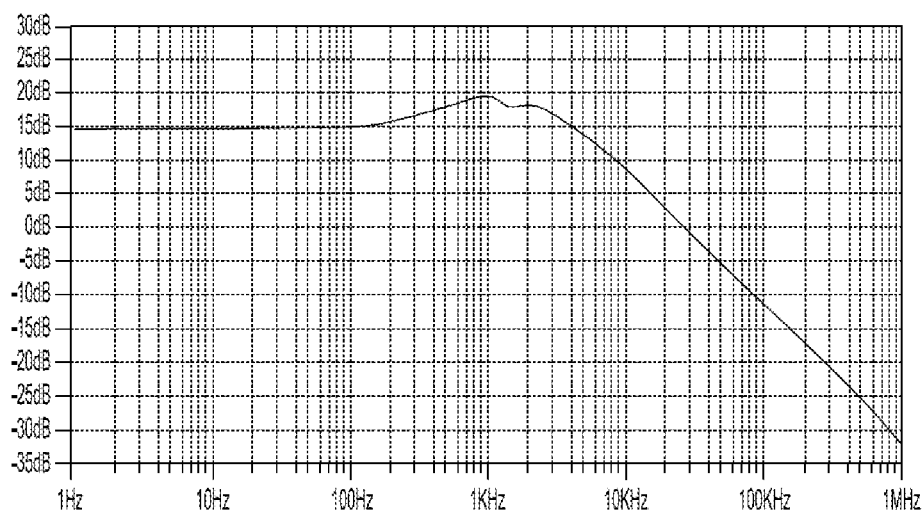

In order to visually compare and display the gain-frequency Bode diagram of each stage of circuit in FIG. 9, the circuit shown in FIG. 9 can be divided into two stages of circuit for gain measurement, as shown in FIG. 10. In FIG. 10, the circuit is divided into two parts by a dotted box 1001 and a dotted box 1002 for gain measurement in different situations, and measurement results are shown in FIG. 11A to FIG. 11C. With reference to the above description, the parameters used in the circuit may be as follows: ω0=2π·1.5 KHz; ωz=2π·300 Hz; BWOPA_in_rad/s=2π·700 KHz; C=1 u; Rp=530 R; and Rm=49.5 kR.

FIG. 11A shows a signal gain-frequency Bode diagram of the part of circuit included in the dotted box 1001, and the corresponding measurement situation is: a signal is input at a point A and the obtained gain is measured at a point B. In other words, FIG. 11A shows a gain curve at the voltage regulator stage when the peak compensation circuit is not used. The curve in FIG. 11A shows a gain dip caused by the LC series resonance in the LC filter circuit, and the gain dip occurs at the resonance frequency of the LC.

FIG. 11B shows a signal gain-frequency Bode diagram of the part of circuit included in the dotted box 1002, and the corresponding measurement situation is: a signal is input at a point B and the obtained gain is measured at a point C. FIG. 11B shows that the peak compensation circuit can generate corresponding gain peaks at corresponding resonance frequencies.

FIG. 11C shows a signal gain-frequency Bode diagram after two stages of circuit included in the dotted box 1001 and the dotted box 1002 are connected in series, and the corresponding measurement situation is: a signal is input at a point A and the obtained gain is measured at a point C. It can be seen from FIG. 11C that the gain dip almost disappears at the LC resonance frequency.

In one or more embodiments of the present disclosure, a method of arranging a peak compensation circuit in an OVP circuit is used, and a gain peak is generated at a resonance frequency of an LC filter through the peak compensation circuit, thereby correspondingly compensating for a gain dip generated by the LC filter at the resonance frequency of the LC filter. The benefit of this peak method compensation is that an open-loop gain at a dip frequency does not need to be increased too much, and therefore, the crossover frequency can be kept below the pole frequency introduced by other circuits in a control loop, so as to make the compensation easier to achieve.

Clause 1. A power filter, including:
an overvoltage protection circuit, and
an LC filter circuit connected to the overvoltage protection circuit,
wherein the overvoltage protection circuit includes a voltage regulator and a peak compensation circuit, and the peak compensation circuit is configured to generate a gain peak at a resonance frequency of the LC filter circuit, so as to compensate for a gain dip at the voltage regulator stage occurring at the resonance frequency of the LC filter circuit.

Clause 2. The power filter according to clause 1, wherein the peak compensation circuit is implemented as an LCR parallel resonance circuit.

Clause 3. The power filter according to any one of the above clauses, wherein the peak compensation circuit includes an equivalent inductance circuit and RC components connected in parallel.

Clause 4. The power filter according to any one of the above clauses, wherein the RC components include a first resistor and a first capacitor connected in parallel, and the equivalent inductance circuit includes an operational amplifier and a second resistor connected between a reverse input terminal and an output terminal of the operational amplifier.

Clause 5. The power filter according to any one of the above clauses, wherein the peak compensation circuit further includes a first voltage-dividing resistor and a second voltage-dividing resistor connected in series.

Clause 6. The power filter according to any one of the above clauses, wherein the LC filter circuit includes a filter inductor and a filter capacitor connected in series, a first terminal of the filter inductor is connected to the voltage regulator, a second terminal of the filter inductor is connected to a first terminal of the filter capacitor, and a second terminal of the filter capacitor is connected to a ground terminal.

Clause 7. The power filter according to any one of the above clauses, wherein a first terminal of the first voltage-dividing resistor is connected to the voltage regulator and is connected to the first terminal of the filter inductor, a second terminal of the first voltage-dividing resistor is connected to a first terminal of the second voltage-dividing resistor, a second terminal of the second voltage-dividing resistor is connected to the ground terminal, and the second terminal of the first voltage-dividing resistor and the first terminal of the second voltage-dividing resistor are connected to a forward input terminal of the operational amplifier.

Clause 8. The power filter according to any one of the above clauses, wherein a first terminal of the first capacitor is connected to a first terminal of the first resistor, and the first terminal of the first capacitor and the first terminal of the first resistor are also connected to the reverse input terminal of the operational amplifier.

Clause 9. The power filter according to any one of the above clauses, wherein the output terminal of the operational amplifier is connected to the voltage regulator.

Clause 10. The power filter according to any one of the above clauses, wherein the voltage regulator is an MOSFET regulator or a triode regulator.

The description of the embodiments has been presented for the purposes of illustration and description. Appropriate modifications and changes to the embodiments may be performed in view of the above description, or the appropriate modifications and changes may be obtained by practice. The described methods and associated actions may also be performed concurrently and/or synchronously in various orders other than those described in this application. The described system is exemplary in nature and may include other elements and/or omit elements. The subject of the present disclosure includes all novel and non-obvious combinations of various systems and configurations disclosed and other features, functions, and/or properties.

As used in this application, an element or a step recited in a singular form and preceded by the word "a/one" should be understood as not excluding a plurality of the elements or steps, unless such exclusion is indicated. Furthermore, references to "one embodiment" or "one example" of the present disclosure are not intended to be interpreted as excluding the existence of additional embodiments that also incorporate the recited features. The present invention has been described above with reference to specific embodiments. However, those skilled in the art will appreciate that various modifications and changes can be made without departing from the broader spirit and scope of the present invention as set forth in the appended claims.

The invention claimed is:

1. A power filter, comprising:
an overvoltage protection circuit, and
an LC filter circuit connected to the overvoltage protection circuit,
wherein the overvoltage protection circuit comprises a voltage regulator and a peak compensation circuit, and the peak compensation circuit is configured to generate a gain peak at a resonance frequency of the LC filter circuit, so as to compensate for a gain dip at the voltage regulator stage occurring at the resonance frequency of the LC filter circuit, wherein the peak compensation circuit comprises an equivalent inductance circuit and RC (resistor-capacitor) components connected in parallel, and wherein the RC components comprise a first resistor and a first capacitor connected in parallel, and the equivalent inductance circuit comprises an operational amplifier and a second resistor connected between a reverse input terminal and an output terminal of the operational amplifier.

2. The power filter according to claim 1, wherein the peak compensation circuit is implemented as an LCR parallel resonance circuit.

3. The power filter according to claim 1, wherein the peak compensation circuit further comprises a first voltage-dividing resistor and a second voltage-dividing resistor connected in series.

4. The power filter according to claim 3, wherein the LC filter circuit comprises a filter inductor and a filter capacitor connected in series, a first terminal of the filter inductor is connected to the voltage regulator, a second terminal of the filter inductor is connected to a first terminal of the filter capacitor, and a second terminal of the filter capacitor is connected to a ground terminal.

5. The power filter according to claim 4, wherein a first terminal of the first voltage-dividing resistor is connected to the voltage regulator and is connected to the first terminal of the filter inductor, a second terminal of the first voltage-dividing resistor is connected to a first terminal of the second voltage-dividing resistor, a second terminal of the second voltage-dividing resistor is connected to the ground terminal, and the second terminal of the first voltage-dividing resistor and the first terminal of the second voltage-dividing resistor are connected to a forward input terminal of the operational amplifier.

6. The power filter according to claim 5, wherein a first terminal of the first capacitor is connected to a first terminal of the first resistor, and the first terminal of the first capacitor and the first terminal of the first resistor are also connected to the reverse input terminal of the operational amplifier.

7. The power filter according to claim 1, wherein the output terminal of the operational amplifier is connected to the voltage regulator.

8. The power filter according to claim 1, wherein the voltage regulator is an MOSFET regulator or a triode regulator, and wherein a slope of a gain-frequency curve at a crossover frequency is −20 dB/dec.

\* \* \* \* \*